United States Patent [19]

Kemlage

[11] 4,437,897  
[45] Mar. 20, 1984

[54] FABRICATION PROCESS FOR A SHALLOW EMITTER/BASE TRANSISTOR USING SAME POLYCRYSTALLINE LAYER

[75] Inventor: Bernard M. Kemlage, Kingston, N.Y.

[73] Assignee: International Business Machines Corporation, Armonk, N.Y.

[21] Appl. No.: 379,535

[22] Filed: May 18, 1982

[51] Int. Cl.³ ................ H01L 21/425; H01L 21/265; H01L 21/225

[52] U.S. Cl. .................... 148/1.5; 29/576 B; 148/187; 357/34; 357/91

[58] Field of Search ................ 148/1.5, 187; 357/34, 357/91; 29/576 B

[56] References Cited

U.S. PATENT DOCUMENTS

| | | | |
|---|---|---|---|
| 4,063,967 | 12/1977 | Graul | 148/1.5 |
| 4,104,086 | 8/1978 | Bondur | 148/1.5 |
| 4,125,426 | 11/1978 | Inayoshi et al. | 148/1.5 |
| 4,157,269 | 6/1979 | Ning et al. | 148/1.5 |
| 4,160,991 | 7/1979 | Anantha et al. | 357/49 |
| 4,190,466 | 2/1980 | Bhattacharya et al. | 148/1.5 |
| 4,234,357 | 11/1980 | Scheppele | 148/1.5 |
| 4,234,362 | 11/1980 | Riseman | 148/187 |
| 4,313,255 | 2/1982 | Shinozaki et al. | 148/190 |

OTHER PUBLICATIONS

Horng et al., IBM-TDB, 23 (1980) 3236.
Anantha et al., IBM-TDB, 23 (1980) 585.
IBM Technical Disclosure Bulletin, vol. 23, No. 9, Feb. 1981, "Shallow Emitter Process for Bipolar Transistors".

Primary Examiner—Upendra Roy  
Attorney, Agent, or Firm—Joseph E. Kieninger

[57] ABSTRACT

A method for fabricating a high performance bipolar device having a shallow emitter and a narrow intrinsic base region is described. The method uses a minimum number of process steps. The method involves providing a silicon semiconductor body having regions of monocrystalline silicon isolated from one another by isolation regions and a buried subcollector therein. A layer of polycrystalline silicon is deposited on the silicon substrate. The surface of the polycrystalline silicon is oxidized and the polycrystalline silicon is implanted with a base impurity. Silicon nitride and oxide layers are deposited on the polysilicon layer. An opening is made in the surface oxide layers and the silicon nitride layer to define the emitter area. The polycrystalline silicon is thermally oxidized to drive the base impurity into the substrate. The thermal oxide is removed in an isotropic etch to form a sidewall. The emitter impurity is ion implanted into the polycrystalline silicon in the emitter area and then driven into the substrate. The collector, base and emitter contact openings are made and the conductive metallurgy is formed.

9 Claims, 4 Drawing Figures

FABRICATION PROCESS FOR A SHALLOW EMITTER/BASE TRANSISTOR USING SAME POLYCRYSTALLINE LAYER

DESCRIPTION

1. Technical Field

This invention relates to a method using a minimum number of process steps for fabricating a high performance bipolar device having a shallow emitter and a narrow intrinsic base region.

2. Background Art

The fabrication of shallow emitter/base structures in single crystal silicon substrates by ion implantation suffers from a number of problems. These problems are (1) the accidental channeling of the base dopant, that is boron, during ion implantation results in a shallow implantation concentration versus depth slope, (2) residual damage from the base implantation, (3) residual damage from emitter implantation, that is, arsenic, (4) enhanced base diffusion during the emitter activation cycle with a corresponding drop in the emitter/base junction concentration, and (5) the retardation of the base dopant by the emitter dopant during emitter activation and drive in. These problems resulting from ion implantation performed in single crystal substrates make shallow structures unfeasible.

The use of an ion implanted polycrystalline silicon as a dopant source for use in a semiconductor body is described in U.S. Pat. No. 4,063,967 and in U.S. Pat. No. 4,210,473. Arsenic doped polysilicon is used as a diffusion source for forming defect-free shallow emitters in epitaxial silicon as described in IBM Technical Disclosure Bulletin Vol. 23 No. 9 Feb. 1981 pp. 4137–4139 and in U.S. Pat. No. 4,160,991. The processes used in the latter two references require a large number of steps to produce the desired device. The resultant device also has some inherent deficiencies.

SUMMARY OF THE INVENTION

It is a primary object of this invention to provide a method using a minimum number of process steps for fabricating a high performance bipolar device having a shallow emitter and a narrow intrinsic base region.

It is another object of this invention to provide a method for fabricating a high performance bipolar device having a single base implant to produce both the intrinsic base and the extrinsic base.

These and other objects are accomplished by a method using a minimum number of process steps to fabricate a high performance bipolar device having a shallow emitter and a narrow intrinsic base region. The method involves providing a silicon semiconductor body having regions of monocrystalline silicon isolated from one another by isolation regions and a buried subcollector therein. A surface layer of silicon dioxide is provided with areas removed by lithographic techniques in which the extrinsic base, intrinsic base and emitter regions are to be formed. A layer of polycrystalline silicon is deposited on the silicon substrate. The surface of polycrystalline silicon is oxidized and the polycrystalline silicon is implanted with the base impurity. Lithographic techniques are used to remove the oxide and polycrystalline silicon leaving these layers in the extrinsic base, intrinsic base and emitter regions. A silicon nitride layer is deposited on the surface followed by a layer of CVD oxide. An opening is made in the surface oxide layers and the silicon nitride layer to define the emitter area. The polycrystalline silicon is partially thermally oxidized to drive the base impurity into the substrate. This thermal oxide is removed using an isotropic etch such as reactive ion etching to expose the polycrystalline silicon of the emitter area. The emitter impurity is ion implanted into the polycrystalline silicon in the emitter area and then driven into the substrate. The collector, base and the emitter contact openings are formed using lithography and etching techniques followed by the deposition and definition of conductive metallurgies.

Other objects of this invention will be apparent from the following detailed description, reference being made to the accompanying drawings wherein the specific process steps of the invention are shown.

DESCRIPTION OF THE PREFERRED EMBODIMENT

Figure 1:
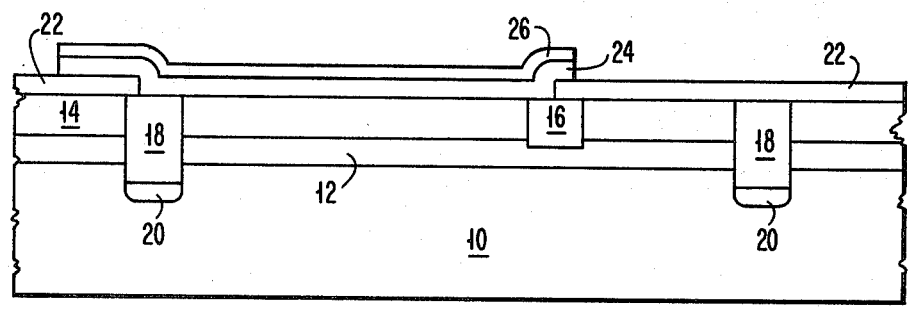
FIGS. 1–4 illustrate the method of fabricating one form of the high-performance shallow emitter/base device of the present invention.

Referring now more particularly to FIGS. 1–4, the manufacturing steps of one form of the invention, the device is fabricated by starting with the wafer or substrate 10 of p-monocrystalline silicon material. The process is illustrated to form a NPN bipolar device integrated circuit. However, it would be obvious that PNP bipolar device integrated circuits can alternatively be formed by simply reversing the polarities of the various elements of the transistors in the associated regions. The p-substrate 10 has a subcollector N+ diffusion made therein to form layer 12. The wafer is placed in an epitaxial growth chamber wherein an epitaxial layer 14 is grown on the surface of the diffused layer 12. The epitaxial layer may be any desired thickness, however, for the purposes of high performance devices of the type involved in the present invention, the thickness should be less than about 2 microns. The preferred thickness of the expitaxial layer is about 1.2 microns.

The isolation regions 16 and 18 are openings that are filled with a suitable dielectric material such as vapor deposited silicon dioxide. P+ regions 20 can also be formed in the substrate 10 in the designated areas under the dielectric isolation regions 18 to act as channel stops preventing inversion. The regions 18 isolate monocrystalline silicon regions from other monocrystalline silicon regions and region 16 isolates the base-emitter region from the collector reach-through region. There are many ways in the art to form dielectric regions of this type. One process for forming these isolation regions is described in U.S. Pat. No. 4,104,086 entitled "Method for Forming Isolated Regions of Silicon" by J. A. Bondur and H. B. Poggee. Alternatively, the partial dielectric isolation may be formed according to the methods described in either patent application Ser. No. 296,929 filed Aug. 27, 1981 by R. C. Joy et al, entitled "Isolation for High Density Intergrated Circuits" or patent application Ser. No. 296,933 filed Aug. 27, 1981 by R. C. Joy et al entitled "Isolation for High Density Integrated Circuits." In those patent applications and patent the processes for forming partial dielectric isolation for regions 16, 18 and 20 are described in detail.

In accordance with this invention a mask layer 22 is provided over the semiconductor body covering those regions designated to be collector reach-through regions and open to those designated the emitter, intrinsic base and extrinsic base regions. The mask layer may be a chemical vapor deposited silicon dioxide layer of about 2000Å in thickness. The preferred process for depositing such a layer is a conventional low pressure, low temperature chemical vapor deposited silicon dioxide using silane and oxygen at about 450° C. Alternatively, the mask layer 22 may be comprised of a combination of layers of silicon dioxide and silicon nitride or other dielectric materials. The openings in layer 22 are formed by conventional lithography and masking procedures. A layer 24 of polysilicon is deposited on the surface of the silicon body wherein there are openings to the monocrystalline silicon body. The polycrystalline silicon layer 24 makes ohmic contact to these regions which are designated to be the extrinsic base regions. Elsewhere, the polycrystalline silicon layer is formed over the mask layer 22. The thickness of the polysilicon layer 24 is 1000 to 5,000Å with the preferred thickness being about 2300Å. The polysilicon layer 24 is deposited over the entire wafer by using preferably a low pressure chemical vapor deposition process which includes reacting silane, $SiH_4$, at a reactor pressure of about 500 millitorr and a reactor temperature of about 625° C. for a growth rate of about 100Å/min. The polysilicon layer 24 is then subjected to thermal oxidation to provide a silicon dioxide layer 26 of between 200Å to 3000Å with a preferred thickness being 800Å.

The structure is put into an ion implantation apparatus wherein boron is implanted into the polysilicon layer 24 to the desired doping concentration. The average doping level is between about $1 \times 10^{18}$ atoms/cc in the polycrystalline silicon layer 24 with a preferred concentration of about $4 \times 10^{19}$ atoms/cc. During this implant, the boron is kept in the polysilicon layer 24. Photolighography and etching techniques are utilized to remove the silicon dioxide 22 and polycrystalline silicon layer 24 from all areas except the extrinsic base, intrinsic base and emitter regions.

Figure 2:
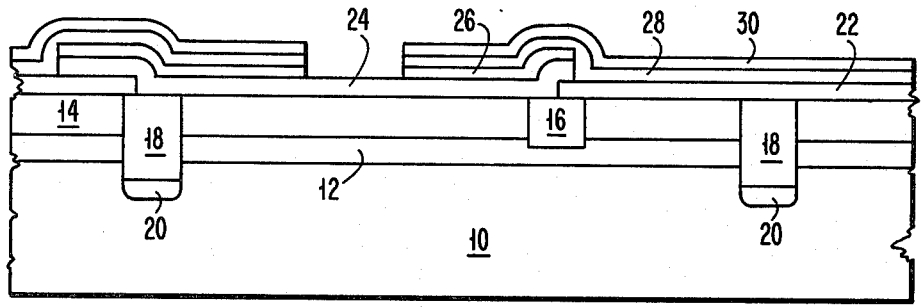

As shown in FIG. 2, a layer 28 of silicon nitride, preferably 1000Å, is formed over the surface of the wafer. The silicon nitride layer is formed by RF sputtering or preferably by pyrolytic deposition from a mixture of silane and ammonia in an $N_2$ ambient at 800° C. A layer of silicon dioxide 30 is then formed over the silicon nitride layer 28. The silicon dioxide layers 26 and 30 and the silicon nitride layer 28 serve as a thermal oxidation screen. Photolithography and etching techniques are then used to etch portions of the screen consisting of silicon dioxide layers 26 and 30 and silicon nitride layer 28 from the surface of the polysilicon layer 24. The etched region is designated to be the emitter and intrinsic base regions.

Figure 3:
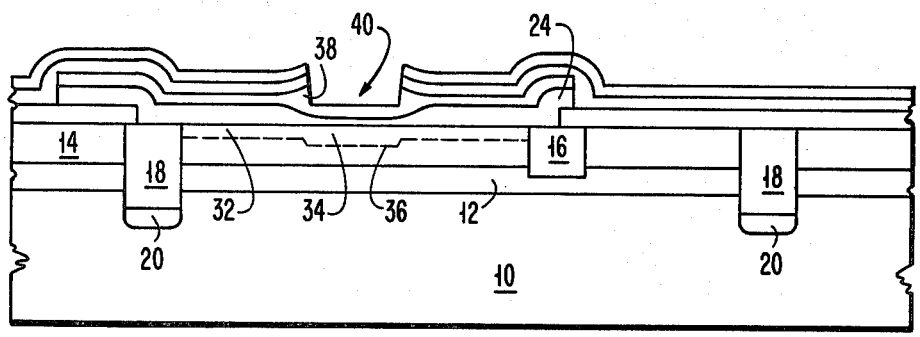

As shown in FIG. 3, the structure is placed in a suitable heating apparatus wherein the ion implanted polysilicon layer 24 is heated to a temperature of between 800° C. to 1000° C. in an oxidizing atmosphere, for example, at approximately 900° C. for two minutes in oxygen. The effect of this heat treatment is to drive the boron about 950Å in the epitaxial layer 14 to form the extrinsic base region 32 and the intrinsic base region 34 thereby forming a PN junction 36. At the same time during the dry-wet-dry drive-in oxidation step, an oxide 38 is formed at the sides of the polysilicon base region 24 while a portion of the polysilicon layer 24 in the emitter opening region 40 is consumed while no polysilicon protected by the screen is consumed. This thermal oxidation step also causes an enhancement of the boron diffusivity at higher concentrations which produces a steeper slope and slightly deeper $H_j$ (the intrinsic base junction depth) in the intrinsic base region 34 and a depletion of the $C_o$ in the polycrystalline silicon layer 24 in the intrinsic base region 34. The remaining polycrystalline silicon layer 24 in the intrinsic base region 34 has a thickness of from about 200Å to 4000Å with the preferred thickness being about 1200Å.

Figure 4:
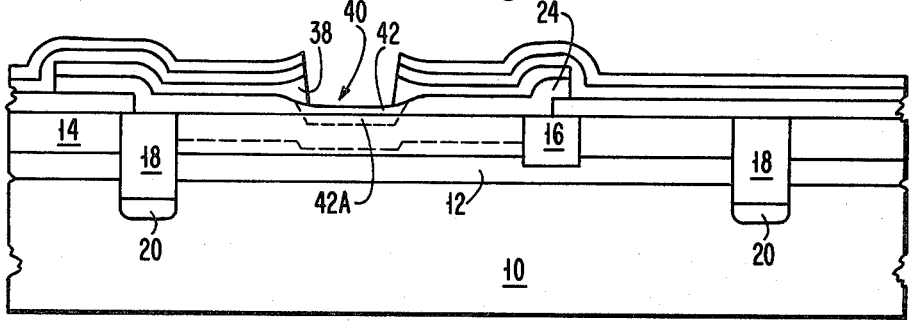

As shown in FIG. 4, the thermal oxide that is formed in the emitter opening region 40 is removed using an isotropic etch such as reactive ion etch to provide sidewall coverage of polycrystalline silicon region 24 while exposing the remaining polycrystalline silicon region in the emitter opening region 40. The structure is now ready for ion-implantation of the emitter. Alternatively, an additional layer of silicon dioxide of between about 100Å to 10,000Å in thickness can now be grown and removed using an isotropic etch to increase the width of the sidewall coverage of polysilicon region 24. This layer can be silicon dioxide or a combination of silicon dioxide and silicon nitride. For a more detailed description of the sidewall process, see J. Riseman U.S. Pat. No. 4,234,362 issued Nov. 18, 1980. The structure is placed in a suitable ion-implantation apparatus where the emitter implantation is made. The preferred implant material is arsenic of about $1 \times 10^{15}$ to $1 \times 10^{16}$ atoms/cm² applied at an energy of 5 to 50 kev in a vacuum. This dosage gives an average arsenic doping level in the polycrystalline silicon layer 24 in the emitter opening 40 of between $5 \times 10^{19}$ and $2 \times 10^{21}$ arsenic ions/cc. The preferred conditions are $4 \times 10^{15}$ atoms/cm² at 30 Kev for a polycrystalline silicon layer of 1200Å. The resulting structure is shown in FIG. 4 wherein the emitter 42 is entirely in the polysilicon layer 24. The structure is now taken from the ion implantation apparatus and put into a heat treating apparatus. The structure is heat-treated at an elevated temperature between about 800° C. to 1000° C., the preferred temperature being 900° C. for 60 minutes in dry oxygen and then 30 minutes in nitrogen. This causes the drive-in of the impurity from the emitter region 42 in the polysilicon layer 24 into the emitter region 42A in the single crystal epitaxial layer 14. This drive-in step consumes of the order of 400Å of the polysilicon emitter region 40. The device is then completed by using standard lithographic techniques to open the contacts and form the metallurgy.

The method described in FIGS. 1 through 4 results in a number of advantages such as there is no implant damage in the single crystal material, the intrinsic base 34 junction depth is greater or equal to that of the extrinsic base 32, the single base implant produces both the intrinsic and the extrinsic base, the polybase perimeter in the emitter region is thermally oxidized for good quality SiO2/Si interface, part of the emitter/base junction is in the polysilicon, enhanced emitter diffusivity in polysilicon minimizes the base emitter metal leakage and shorts, the reduction in process complexity, the shallow emitter/base junctions are achieved, the partial polycrystalline silicon emitter increases the gain.

Although a preferred embodiment of this invention has been described, it is understood that numerous variations may be made in accordance with the principles of this invention.

What is claimed is:

1. A process for forming a transistor having a shallow emitter region and a narrow intrinsic base region and an extrinsic base region using the same polycrystalline silicon layer comprising the steps of depositing a layer of polycrystalline silicon on a semiconductor substrate provided with a subcollector, epitaxy, isolated regions, and oxide surface with holes open in the oxide surface for the extrinsic base, intrinsic base and emitter region, thermally oxidizing the surface of the polycrystalline silicon layer, implanting the base impurity into the polycrystalline silicon layer, defining and removing the surface oxide layer and the polycrystalline silicon layer from the subcollector reach-through area, depositing a silicon nitride layer, depositing a silicon dioxide layer, opening the silicon dioxide layer the silicon nitride layer and the thermal oxide layer to define the intrinsic base and the emitter area, thermally oxidizing the polycrystalline layer and driving the base impurity downwardly into the epitaxial layer to form the extrinsic base region and the intrinsic base region, etching the thermal oxide in the emitter area in an isotropic etch, ion implanting the emitter impurity into the emitter area of the polycrystalline silicon layer, thermally oxidizing to drive the emitter impurity inwardly into the epitaxial layer to form the emitter region, and opening the collector, extrinsic base and emitter contact openings and forming the conductive metallurgy.

2. A process as described in claim 1 whereby the layer of polycrystalline silicon is 1000Å to 5000Å thick.

3. A process as described in claim 1 wherein the said ion implanting of base impurities is boron with an average doping level of between about $1 \times 10^{18}$ to $1 \times 10^{21}$ atoms/cc and is mostly contained within the said polycrystalline silicon layer.

4. A process as described in claim 1 whereby the said polycrystalline silicon which forms the said intrinsic base and said emitter area is partially consumed by said thermal oxidation while the said extrinsic base area is protected by a thermal oxidation screen composed of silicon dioxide, silicon nitride and surface oxide layers.

5. A process as described in claim 4 whereby the said thermal oxidation of the said polycrystalline silicon in the said intrinsic base and emitter areas which drives the said base impurities downwardly into the said epitaxial layer is at a temperature of between about 800° C. to 1000° C.

6. A process as described in claim 1 wherein the resulting PN base-emitter junction is between about 100Å to 2000Å in depth into the said epitaxy and a portion of the said junction is within the said polycrystalline silicon.

7. A process as described in claim 1 wherein the resulting PN base-collector junction is between about 200Å to 4000Å in depth into the said epitaxy.

8. A process for forming a transistor having a shallow emitter region and a narrow intrinsic base region and an extrinsic base region using the same polycrystalline silicon layer comprising the steps of depositing a layer of polycrystalline silicon on a semiconductor substrate provided with a subcollector, epitaxy, isolated regions and oxide surface with holes open in the oxide surface for the extrinsic base, intrinsic base and emitter region, thermally oxidizing the surface of the polycrystalline silicon layer, implanting the base impurity into the polycrystalline silicon layer, defining and removing the surface oxide layer and the polycrystalline silicon layer from the subcollector reach-through area, depositing a silicon nitride layer, depositing a silicon dioxide layer, opening the silicon dioxide layer, the silicon nitride layer and the thermal oxide layer to define the intrinsic base and emitter area, thermally oxidizing the polycrystalline layer and driving the base impurity downwardly into the epitaxial layer to form the extrinsic base region and the intrinsic base region, etching the thermal oxide in the emitter area in an isotropic etch, depositing a silicon dioxide layer, etching the silicon dioxide layer in an isotropic etch, ion implanting the emitter impurity into the emitter area of the polycrystalline silicon layer, thermally oxidizing to drive the emitter impurity inwardly into the epitaxial layer to form the emitter region, and opening the collector, extrinsic base and emitter contact openings and forming the conductive metallurgy.

9. A process as described in claim 8 including the step of depositing a silicon nitride layer on said silicon dioxide layer.

* * * * *